(12) United States Patent
Yang et al.

(10) Patent No.: US 8,332,714 B1
(45) Date of Patent: *Dec. 11, 2012

(54) DEFECT RECOVERY FOR ITERATIVELY-DECODED DATA CHANNEL

(75) Inventors: Shaohua Yang, San Jose, CA (US);
Nedeljko Varnica, San Jose, CA (US);
Nitin Nangare, Santa Clara, CA (US);
Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/362,790

(22) Filed: Jan. 31, 2012

Related U.S. Application Data

(63) Continuation of application No. 11/936,418, filed on Nov. 7, 2007, now Pat. No. 8,122,314.

(60) Provisional application No. 60/864,871, filed on Nov. 8, 2006.

(51) Int. Cl.
*H03M 13/00* (2006.01)
*H04L 1/18* (2006.01)
*G06F 11/00* (2006.01)
*G06F 11/10* (2006.01)

(52) U.S. Cl. ........ 714/752; 714/751; 714/755; 714/758; 714/759; 714/800; 714/807

(58) Field of Classification Search ........................ None
See application file for complete search history.

(56) References Cited

U.S. PATENT DOCUMENTS

| | | | |
|---|---|---|---|
| 6,615,385 B1 | 9/2003 | Kim et al. |
| 6,988,233 B2 | 1/2006 | Kanai et al. |
| 7,219,290 B2 | 5/2007 | Kishino |
| 7,219,295 B2 | 5/2007 | Yamada |
| 2005/0149826 A1 | 7/2005 | Uchida |
| 2007/0153724 A1 | 7/2007 | Cheon et al. |
| 2009/0254792 A1 | 10/2009 | Wang |

*Primary Examiner* — Guerrier Merant

(57) ABSTRACT

In iterative decoding, a data recovery scheme corrects for corrupted or defective data by incorporating results from a previous decoding iteration. In one embodiment, a final multiplexer selects between the final detector output or a previous detector output based on the absence or presence of defective data. In another embodiment, the branch metrics for the defective data, which otherwise would be combined with a priori LLRs from an outer decoder of a prior stage, are ignored so that the a priori LLRs themselves are used alone. The two embodiments can be used together.

16 Claims, 10 Drawing Sheets

DEFECT RECOVERY FOR ITERATIVELY-DECODED DATA CHANNEL

CROSS REFERENCE TO RELATED APPLICATION

This is a continuation of commonly-assigned U.S. patent application Ser. No. 11/936,418, filed Nov. 7, 2007 (now U.S. Pat. No. 8,122,314), which claims the benefit of commonly-assigned U.S. Provisional Patent Application No. 60/864,871, filed Nov. 8, 2006, each of which is hereby incorporated by reference herein in its respective entirety.

BACKGROUND

This invention relates to a method and apparatus for optimizing recovery from defects in a data channel that uses iterative decoding.

In many applications, data—e.g., on a communication channel or in the read channel of a data storage device—is encoded using an outer code. Examples of such codes include turbo codes, Low-Density Parity Check (LDPC) codes, and convolutional codes. Encoded data from an outer code are often interleaved before being transmitted over a data channel. In that data channel, the signal might become corrupted with noise or defects. On the receiver side, the received signal can be decoded using an iterative decoding principle often referred to as turbo decoding. A feature of turbo decoding is that decoding includes multiple stages, each of which includes a detection/equalization block and an outer decoder block. For example, the signal from a detector front end, which may be a finite impulse response (FIR) filter, may be processed by a soft detector—such as a Soft Output Viterbi Algorithm (SOVA) or a Bahl-Cocke-Jelinek-Raviv (BCJR) detector—that operates on branch metrics computed from the FIR signal.

The soft detector provides two outputs—(i) hard decisions for the detected signal and (ii) extrinsic log-likelihood ratios (LLRs), which indicate new reliability information generated by the detector for each of the hard decisions. These LLRs are then de-interleaved and passed to the outer decoder for further processing. The outer soft decoder then provides its own hard decisions as well as new extrinsic LLRs. These LLRs from the outer decoder are then passed to the soft detector as a priori LLRs after interleaving. In the next round of iterative decoding, the soft detector generates new extrinsic LLRs, taking both the a priori LLRs and the FIR signal as inputs. For the first iteration, the a priori LLR inputs to the soft detector are all set to zero. This iterative decoding between soft detector and the outer decoder is carried out until a maximum number of iterations are reached, or a valid code word is found. In the case of an LDPC code, interleaving is inherently embedded inside the LDPC code and hence a separate interleaver and de-interleaver are not required. Iterations can be stopped at the detector or the decoder output.

There are many well-known methods for dealing with channel noise. However, channel defects—i.e., data corruption of a magnitude much greater than noise—must be dealt with differently. In the presence of a channel defect, the FIR signal at the input of the detector is corrupted and thus hard decisions provided by the detector are not reliable and are often in error. A corrupted FIR signal may also cause error propagation to the bits adjacent to the defect location in detector hard decisions. These errors can further propagate in iterative decoding through unreliable extrinsic LLRs at the defect location.

It therefore would be desirable to be able to provide more reliable defect recovery for an iteratively-decoded channel.

SUMMARY

In accordance with the invention, iterations, which may be stopped at the detector or the decoder as discussed above, are stopped at the detector. Typically, defects are dealt with by erasing (setting to zero) the detector output LLRs for the affected bit positions, before passing them to the outer decoder. In an iteratively-decoded channel, for a defective bit position, the outer decoder in a previous stage may have more reliable information than the soft detector, because it sees the erased LLRs at the defect location at its input and it also can benefit from the code structure. Therefore, in accordance with one embodiment of the present invention, when a defective bit is detected, instead of taking the output from the detector, the output of the decoder from the previous stage preferably is used as the output.

In another embodiment, which may be used separately from, or together with, the first embodiment, the branch metrics for the corrupt or defective data are zeroed on the input to the soft detector, so that only a priori LLRs from the outer decoder from the previous stage are used.

Therefore, in accordance with the present invention, there is provided a method for recovering from a defect when decoding a data channel that uses iterative decoding. The method includes, on detection of a defect, discounting data associated with the defect, and basing the result of decoding on outer decoder output from a previous stage.

Apparatus for carrying out the method also is provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

The present invention relies on the presence of better data in a previous stage of an iteratively decoded channel to estimate the correct data in a corrupt or defective data region.

This can be applied to the iterative decoder portion of the data channel or to the computation of the branch metrics, or both.

The invention will now be described with reference to FIGS. 1-3.

Figure 1:
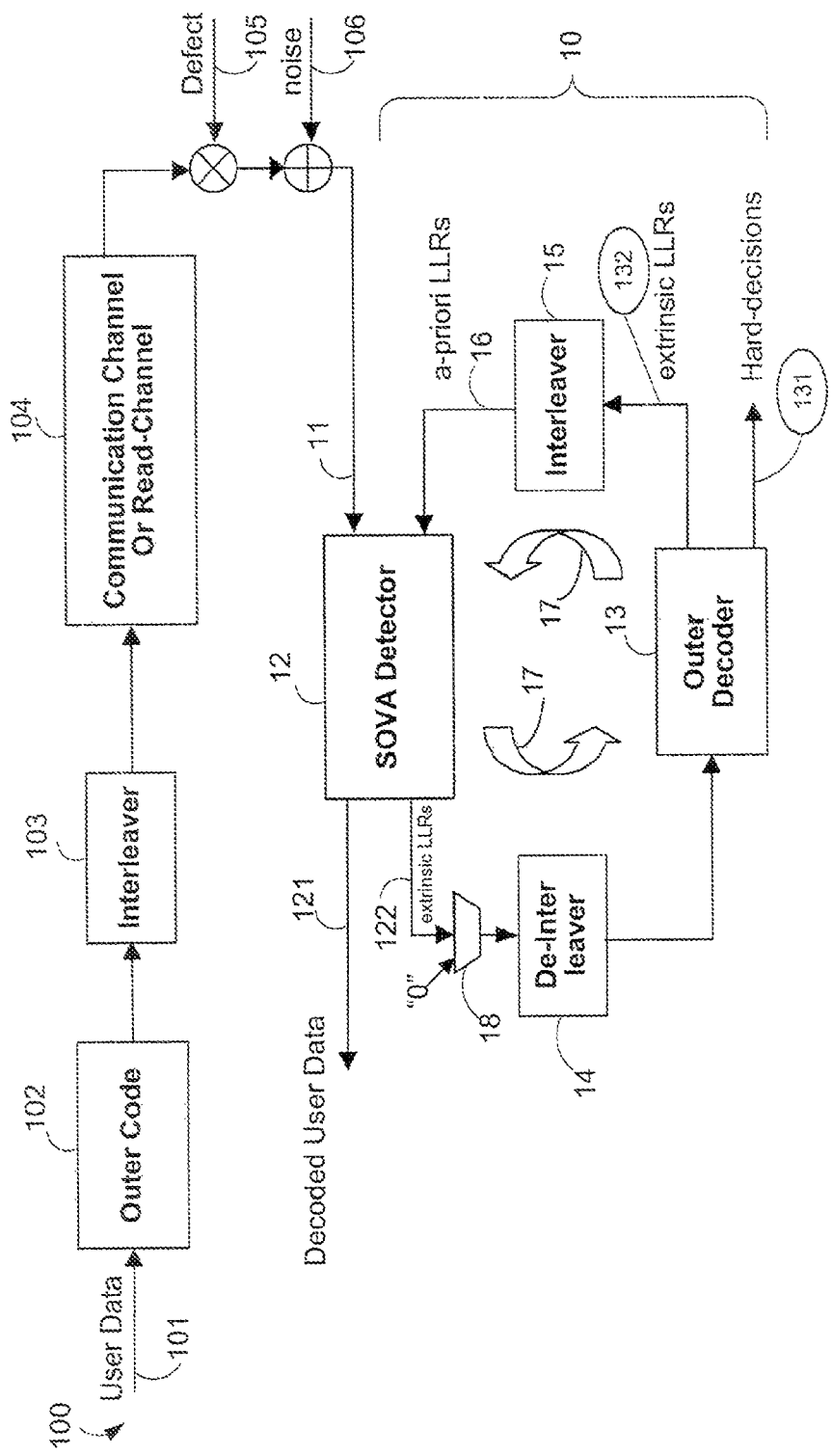
FIG. 1 is a schematic view of a known iteratively-decoded data channel.

FIG. 1 represents a known data channel 100 in which user data are input at 101, encoded using an outer code 102, such as a turbo code, an LDPC code or a convolutional code, interleaved at 103, and then communicated or read in channel 104, where defects 105 and noise 106 may be introduced. Decoder portion 10 is exemplary of a known iteratively-decoded channel. Equalized data from the detector front end (e.g., a FIR filter; not shown) are input at 11. Decoder portion 10 in this example includes a soft decoder 12. In this example, soft decoder 12 includes a SOVA detector, which produces non-return-to-zero (NRZ) output 121, and LLR output 122, and an outer decoder 13 (e.g., an LDPC decoder, a turbo decoder or a convolutional decoder. LLR output 122 of detector 12 passes through de-interleaver 14 before serving as input to outer decoder 13. Outer decoder 13 provides hard decisions 131 and LLR output 132. LLR output 132 passes through interleaver 15 which provides de-interleaved LLRs as a priori LLR inputs 16 to detector 12. As indicated by arrows 17, detector 12 and outer decoder 13 are used iteratively—e.g., there may be three iterations—and detector output 121 is used as the decoded output—i.e., detector 12 is the last stage in the iterative decoding process. As stated above, when corrupt or defective data are detected, LLRs are set to zero—e.g., using multiplexer 18 to select a "0" instead of the LLR—at the defective bit locations. As a result, there is no contribution to the output from defective data.

Figure 2:
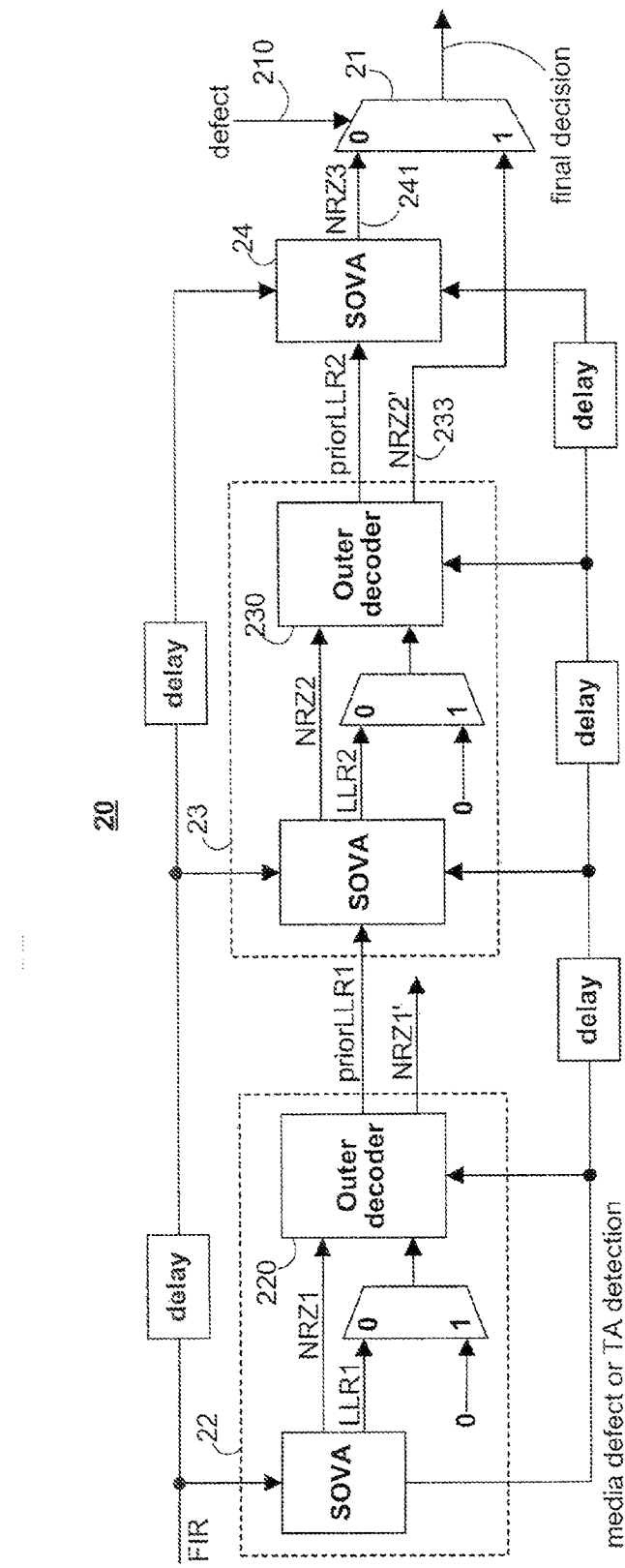
FIG. 2 is a schematic view of an iteratively-decoded data channel in accordance with one preferred embodiment of the present invention.

FIG. 2 illustrates iterative decoder portion 20 according to one embodiment of the present invention, which replaces decoder portion 10. Decoder portion 20 resembles decoder portion 10 (although in FIG. 2 the individual iterations are drawn as different stages 22, 23, 24). Because iterative decoding is stopped at the output of SOVA detector 24, stage 24 does not contain an outer decoder and does not need to output soft information (LLRs). A selector (e.g., a multiplexer) 21 is provided at the output. Selector 21 selects either the output (NRZ3) 241 of soft detector 24 or the output (NRZ2') 233 of an outer decoder 230 of immediately preceding decoder stage 23, under control of selection signal 210. Signal 210 preferably selects output 241 when there is no defect detected in the data, but preferably selects output 233 when there is a defect. As discussed above, this produces a more reliable result, because the outer decoder 230 sees the erased LLRs at the defect location at the input and it also benefits from the code structure whereby LLRs from unaffected locations assist in decoding bits at the defect location. In that way, one is always relying on prior reliable data through the defective data interval.

Figure 3:
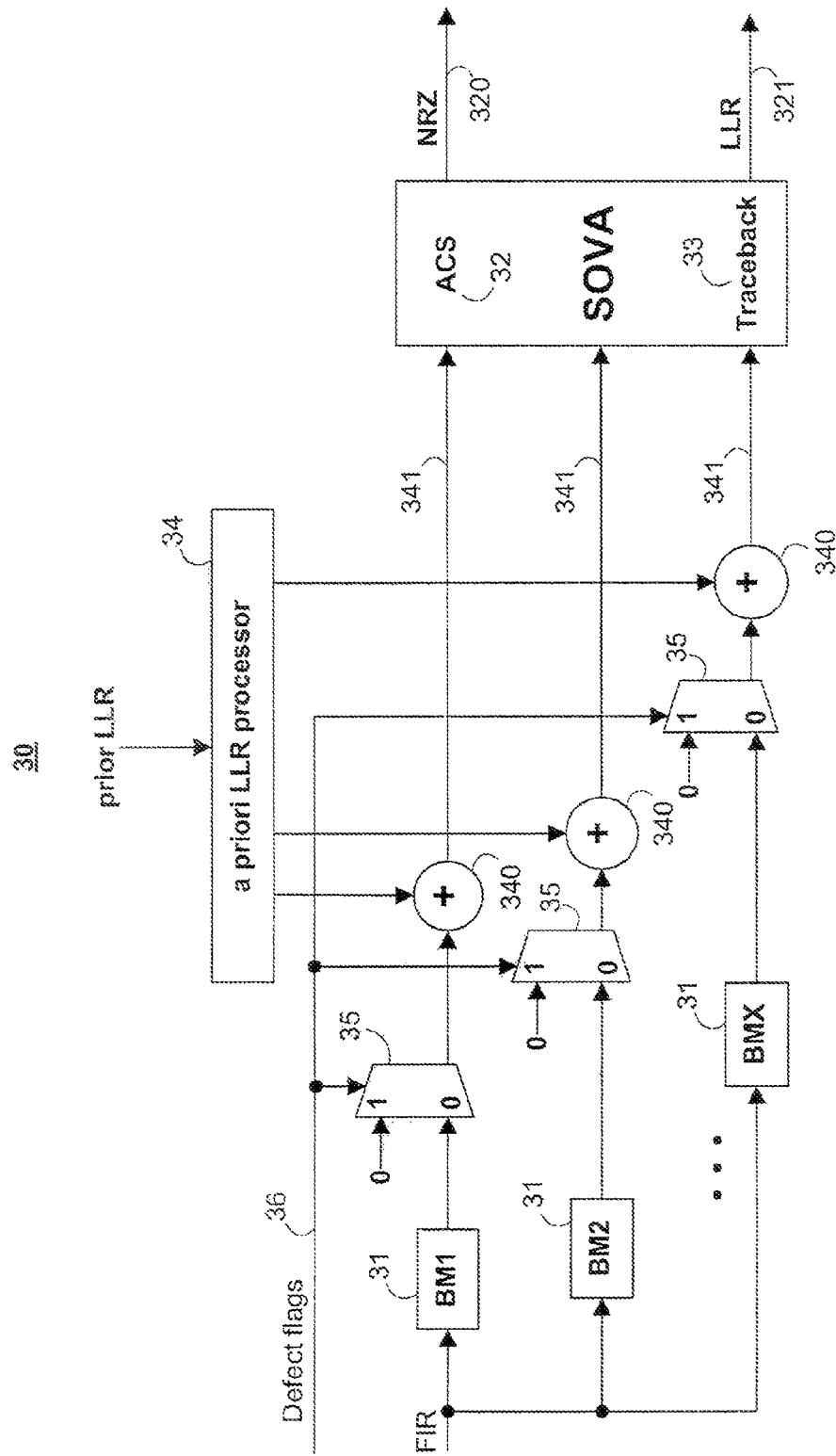
FIG. 3 is a schematic view of a portion of a processing stage of a data channel in accordance with another preferred embodiment of the present invention.

FIG. 3 shows one stage 30 of a SOVA detector similar to one included in each stage 22, 23, 24, modified in accordance with a second embodiment of the present invention. Detector stage 30 is similar to a typical SOVA detector in that it includes branch metric computation units 31 (BM1-BMX), Viterbi add-compare-select (ACS) circuitry 32 to compute the NRZ output 320, and traceback circuitry 33 to compute the LLR output 321. A priori LLR processor 34 takes into account a priori LLR values to provide branch metric offset values that are combined with the branch metrics by adders 340 to provide offset branch metrics 341.

In accordance with this embodiment of the invention, selectors 35 (e.g., multiplexers) are provided in each of the branches. Under control of a defect flag signal 36, during defective data intervals, selectors 35 zero out the contributions from the branch metrics. Thus, during a defective data interval, the offset branch metrics 341 represent only the contributions of a priori LLR processor 34. Although those contributions are smaller than the combined results when the branch metrics are included, ACS circuitry 32 operates primarily on the relative values of its inputs, and so the NRZ results are reliable even when selectors 35 zero out the branch metrics. As in the case of the first embodiment, this embodiment ignores the defective data in favor of more reliable a priori LLRs from an outer decoder.

Although not explicitly shown, it will be apparent that the first and second embodiments can be used together. That is, one may have a decoder portion 20/30 in which, at the front end, the branch metrics are used if the input data are valid but are not used if the input data are defective, as in FIG. 3, while at the output end the result of the final soft detector is used if the input data are valid but the result of the outer decoder from the previous stage is used if the input data are defective, as in FIG. 2.

Figure 4:
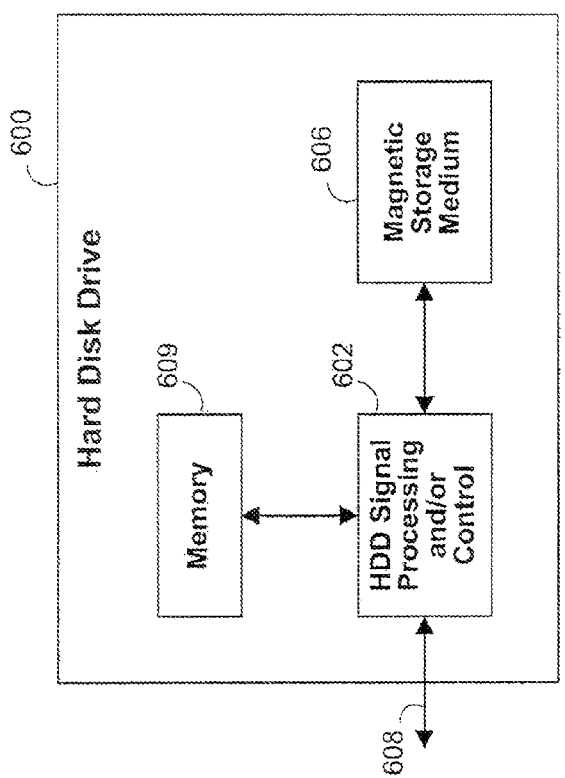
FIG. 4 is a block diagram of an exemplary hard disk drive that can employ the disclosed technology.
Figure 5:
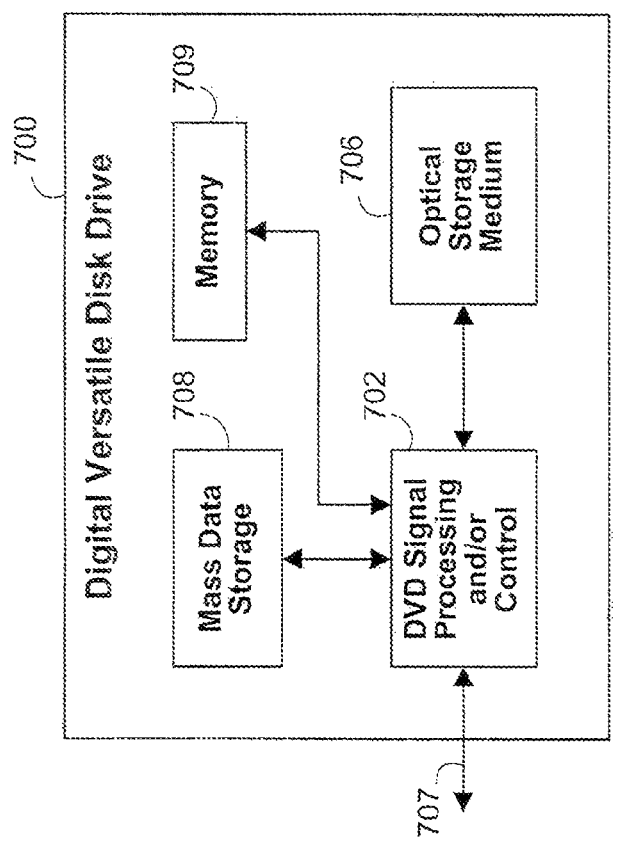
FIG. 5 is a block diagram of an exemplary digital versatile disc drive that can employ the disclosed technology.

Referring now to FIGS. 4 and 5, two exemplary implementations of the present invention are shown.

Referring now to FIG. 4 the present invention can be implemented in a hard disk drive 600. The present invention may implement either or both signal processing and/or control circuits, which are generally identified in FIG. 4 at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular telephones, media or MP3 players and the like, and/or other devices, via one or more wired or wireless communication links 608. The HDD 600 may be connected to memory 609 such as random access memory (RAM), low latency nonvolatile memory such as flash memory, read only memory (ROM) and/or other suitable electronic data storage.

Referring now to FIG. 5 the present invention can be implemented in a digital versatile disk (DVD) drive 700. The present invention may implement either or both signal processing and/or control circuits, which are generally identified in FIG. 5 at 702, and/or mass data storage of the DVD drive 700. The signal processing and/or control circuit 702 and/or other circuits (not shown) in the DVD drive 700 may process data, perform coding and/or encryption, perform calculations, and/or format data that is read from and/or data written to an optical storage medium 706. In some implementations, the signal processing and/or control circuit 702 and/or other circuits (not shown) in the DVD drive 700 can also perform other functions such as encoding and/or decoding and/or any other signal processing functions associated with a DVD drive.

DVD drive 700 may communicate with an output device (not shown) such as a computer, television or other device, via one or more wired or wireless communication links 707. The DVD drive 700 may communicate with mass data storage 708 that stores data in a nonvolatile manner. The mass data storage 708 may include a hard disk drive (HDD). The HDD may be a mini-HDD that includes one or more platters having a diameter that is smaller than approximately 1.8". The DVD drive 700 may be connected to memory 709 such as RAM, ROM, low-latency nonvolatile memory such as flash memory, and/or other suitable electronic data storage.

Figure 6:
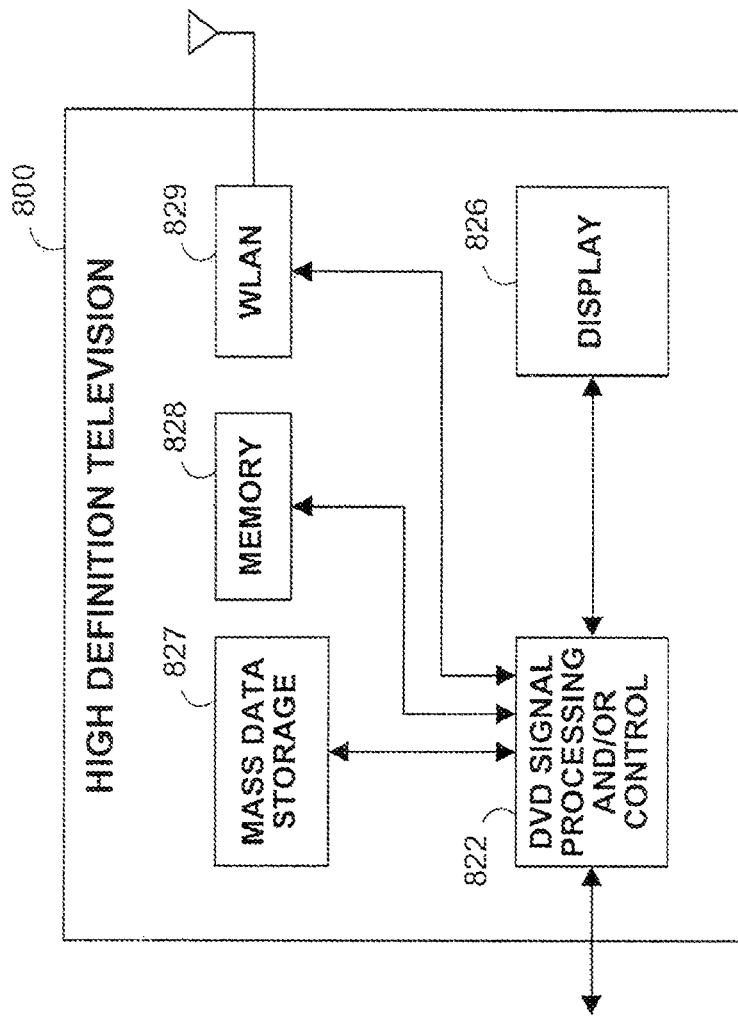
FIG. 6 is a block diagram of an exemplary high definition television that can employ the disclosed technology.

Referring now to FIG. 6, the present invention can be implemented in a high definition television (HDTV) 800. The present invention may implement either or both signal processing and/or control circuits, which are generally identified in FIG. 6 at 822, a WLAN interface and/or mass data storage of the HDTV 800. The HDTV 800 receives HDTV input signals in either a wired or wireless format and generates HDTV output signals for a display 826. In some implementations, signal processing circuit and/or control circuit 822 and/or other circuits (not shown) of the HDTV 800 may process data, perform coding and/or encryption, perform calculations, format data and/or perform any other type of HDTV processing that may be required.

The HDTV 800 may communicate with mass data storage 827 that stores data in a nonvolatile manner such as optical and/or magnetic storage devices. At least one DVD drive may have the configuration shown in FIG. 5. The HDTV 800 may be connected to memory 828 such as RAM, ROM, low-latency nonvolatile memory such as flash memory, and/or other suitable electronic data storage. The HDTV 800 also may support connections with a WLAN via a WLAN network interface 829.

Figure 7:
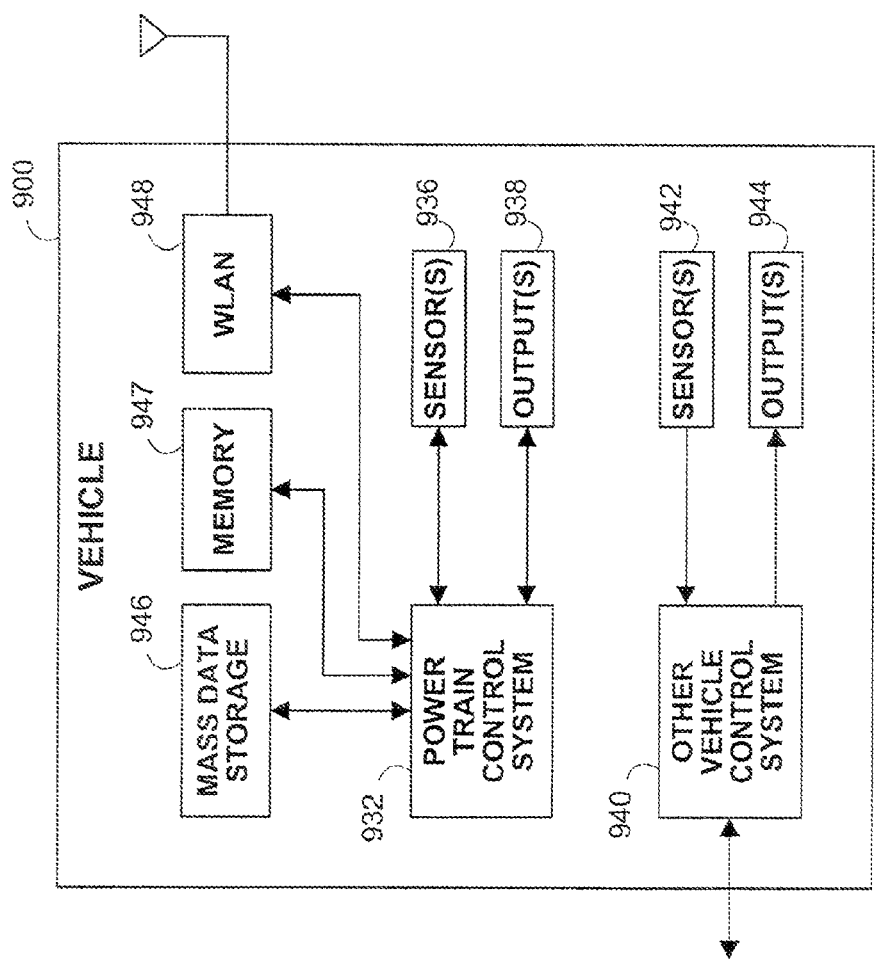
FIG. 7 is a block diagram of an exemplary vehicle that can employ the disclosed technology.

Referring now to FIG. 7, the present invention implements a control system of a vehicle 900, a WLAN interface and/or mass data storage of the vehicle control system. In some implementations, the present invention may implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 900. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices for example hard disk drives HDD and/or DVDs. At least one DVD drive may have the configuration shown in FIG. 5. The powertrain control system 932 may be connected to memory 947 such as RAM, ROM, low latency nonvolatile memory such as flash memory, and/or other suitable electronic data storage. The powertrain control system 932 also may support connections with a WLAN via a WLAN network interface 948. The control system 940 may also include mass data storage, memory and/or a WLAN interface (none shown).

Figure 8:
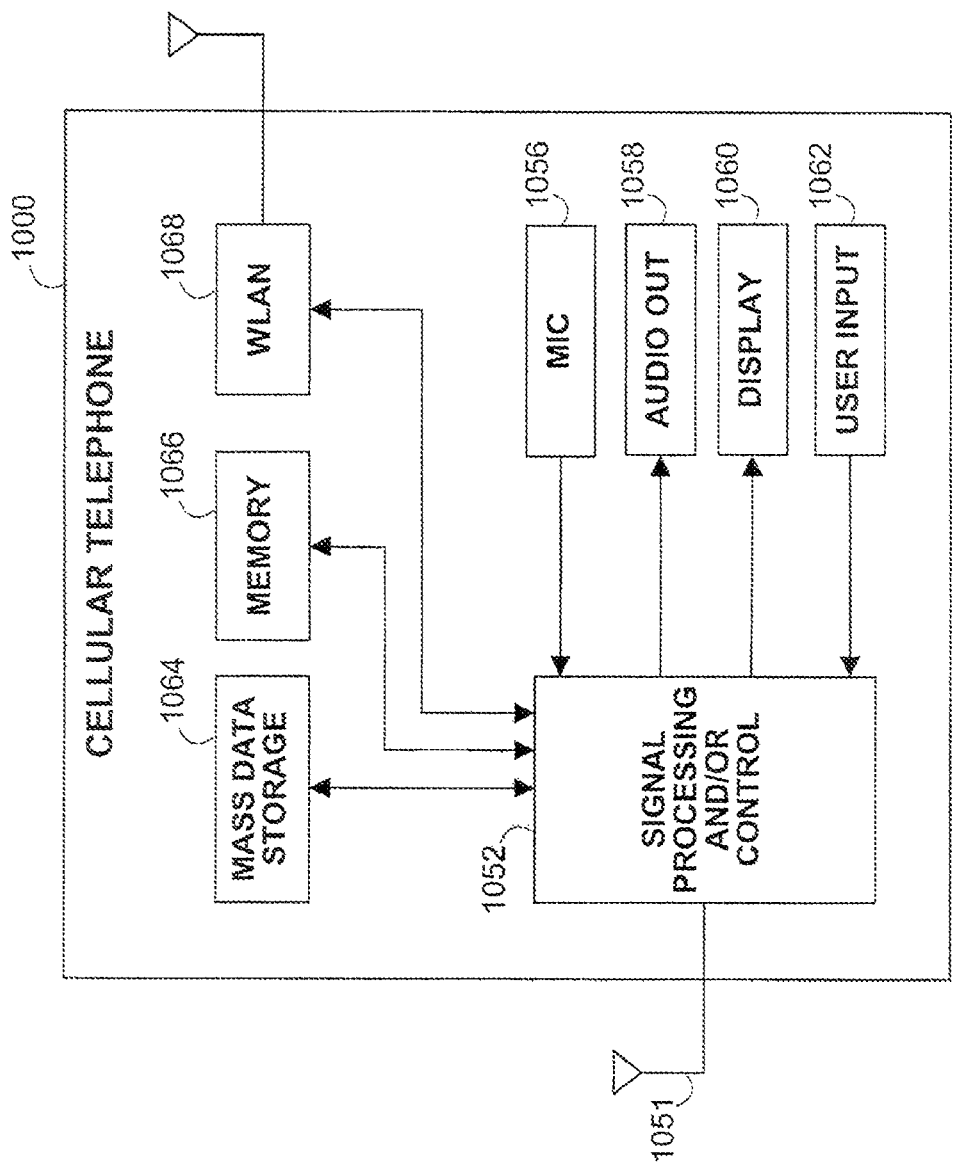
FIG. 8 is a block diagram of an exemplary cellular telephone that can employ the disclosed technology.

Referring now to FIG. 8, the present invention can be implemented in a cellular telephone 1000 that may include a cellular antenna 1051. The present invention may implement either or both signal processing and/or control circuits, which are generally identified in FIG. 8 at 1052, a WLAN interface and/or mass data storage of the cellular phone 1000. In some implementations, the cellular telephone 1000 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular telephone 1050 may process data, perform coding and/or encryption, perform calculations, format data and/or perform other cellular telephone functions.

The cellular telephone 1000 may communicate with mass data storage 1064 that stores data in a nonvolatile manner such as optical and/or magnetic storage devices—for example hard disk drives (HDDs) and/or DVDs. At least one DVD drive may have the configuration shown in FIG. 5. The HDD may be a mini-HDD that includes one or more platters having a diameter that is smaller than approximately 1.8". The cellular telephone 1000 may be connected to memory 1066 such as RAM, ROM, low-latency nonvolatile memory such as flash memory, and/or other suitable electronic data storage. The cellular telephone 1000 also may support connections with a WLAN via a WLAN network interface 1068.

Figure 9:
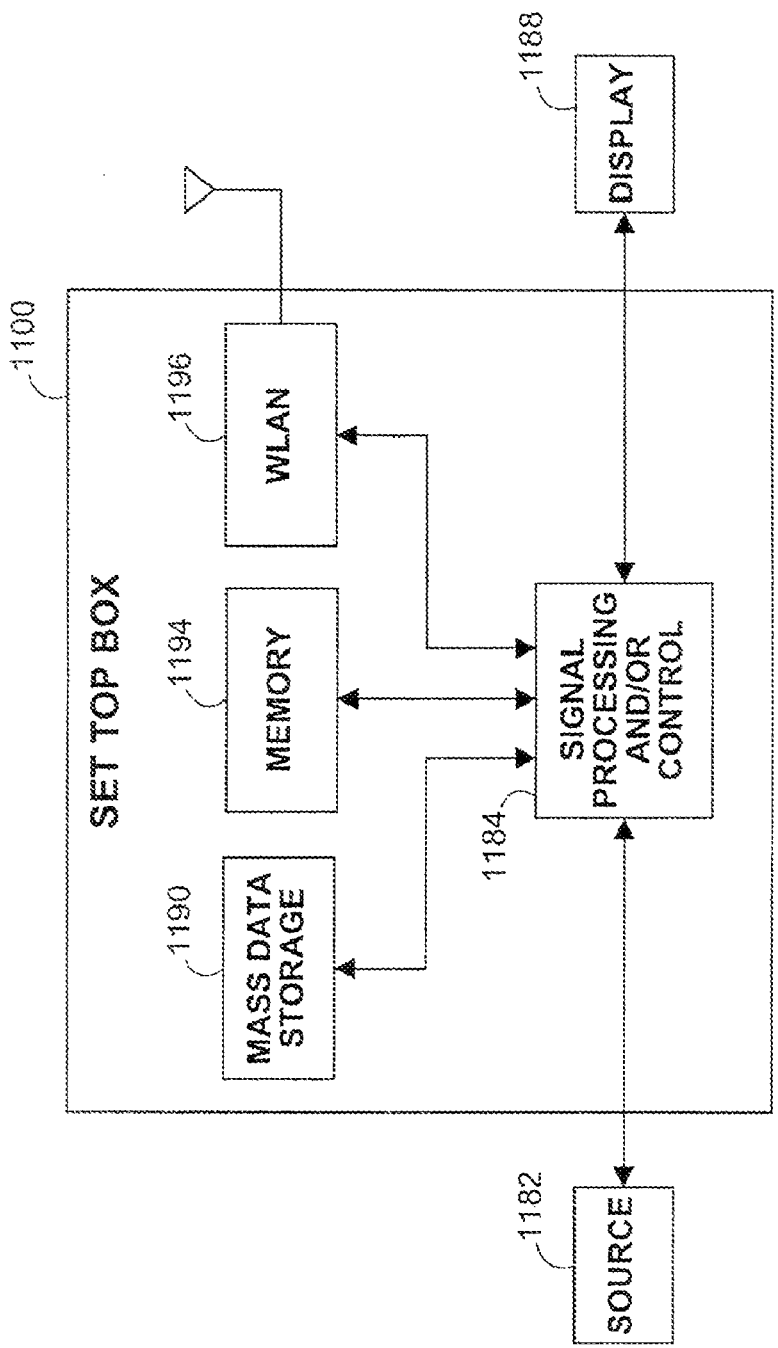
FIG. 9 is a block diagram of an exemplary set top box that can employ the disclosed technology.

Referring now to FIG. 9, the present invention can be implemented in a set top box 1100. The present invention may implement either or both signal processing and/or control circuits, which are generally identified in FIG. 9 at 1184, a WLAN interface and/or mass data storage of the set top box 1100. Set top box 1100 receives signals from a source 1182 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1100 may process data, perform coding and/or encryption, perform calculations, format data and/or perform any other set top box function.

Set top box 1100 may communicate with mass data storage 1190 that stores data in a nonvolatile manner. The mass data storage 1190 may include optical and/or magnetic storage devices for example hard disk drives HDD and/or DVDs. At least one DVD drive may have the configuration shown in FIG. 5. Set top box 1100 may be connected to memory 1194 such as RAM, ROM, low-latency nonvolatile memory such as flash memory, and/or other suitable electronic data storage. Set top box 1100 also may support connections with a WLAN via a WLAN network interface 1196.

Figure 10:
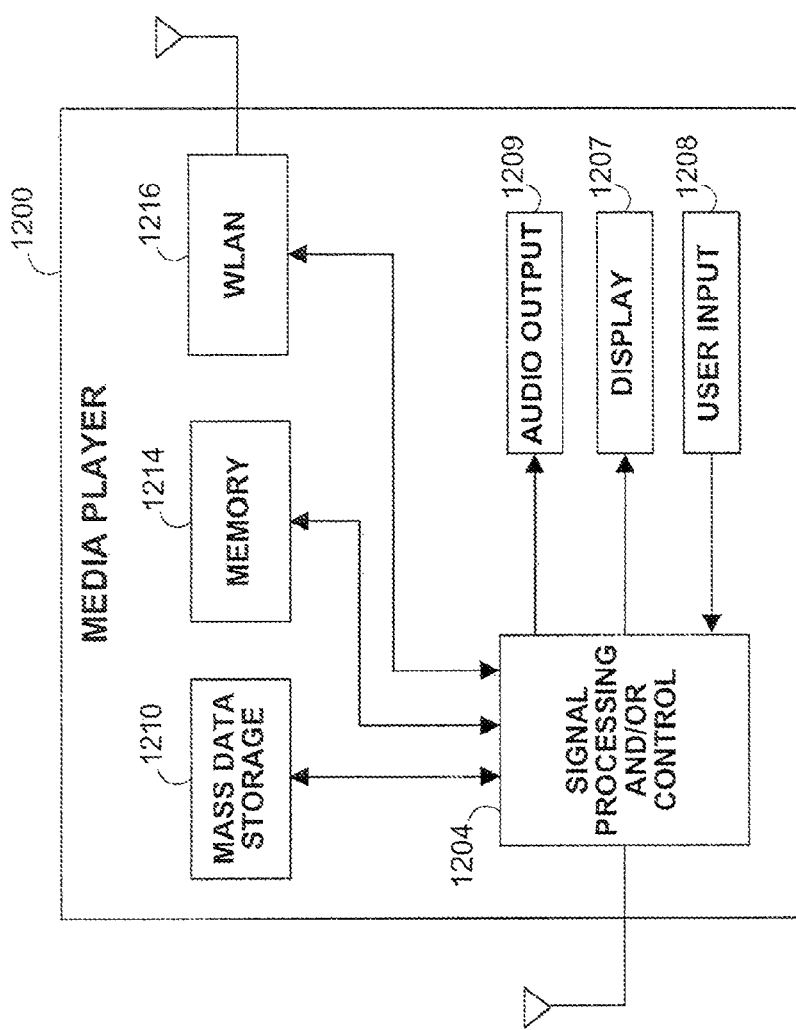
FIG. 10 is a block diagram of an exemplary media player that can employ the disclosed technology.

Referring now to FIG. 10, the present invention can be implemented in a media player 1200. The present invention may implement either or both signal processing and/or control circuits, which are generally identified in FIG. 10 at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. Media player 1200 further includes an audio output 1209 such as a speaker and/or audio output jack. The signal processing and/or control circuits 1204 and/or other circuits (not shown) of media player 1200 may process data, perform coding and/or encryption, perform calculations, format data and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one DVD drive may have the configuration shown in FIG. 5. Media player 1200 may be connected to memory 1214 such as RAM, ROM, low-latency nonvolatile memory such as flash memory, and/or other suitable electronic data storage. Media player 1200 also may support connections with a WLAN via a WLAN network interface 1216. Still other implementations in addition to those described above are contemplated.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. An iterative decoding apparatus for a data channel, including recovery circuitry for recovering from a defect when decoding said data channel, said recovery circuitry comprising:
circuitry that, on detection of said defect, discounts data associated with said defect in a current stage; and
circuitry that directly outputs outer decoder output from a prior stage as an output of said decoding in said current stage.

2. The iterative decoding apparatus of claim 1 wherein:
said data channel includes a final stage and at least one prior stage;
each said stage comprises a soft detector that provides detected data and a log-likelihood ratio;
each stage other than said final stage further comprises an outer decoder that operates on said detected data and said log-likelihood ratio.

3. The iterative decoding apparatus of claim 2 wherein said circuitry that discounts comprises circuitry that ignores said log-likelihood ratio for at least one of said prior stages.

4. The iterative decoding apparatus of claim 3 wherein said circuitry that ignores comprises a selector that selects between said log-likelihood ratio and a zero.

5. A method for recovering from a defect when decoding a data channel that uses iterative decoding, said method comprising:
on detection of said defect, discounting data associated with said defect in a current stage; and
directly outputting outer decoder output from a prior stage as an output of said decoding in said current stage.

6. The method of claim 5 wherein:
said data channel includes a final stage and at least one prior stage;
each said stage comprises a soft detector that provides detected data and a log-likelihood ratio; and
each stage other than said final stage further comprises an outer decoder that operates on said detected data and said log-likelihood ratio.

7. The method of claim 6 wherein said discounting comprises ignoring said log-likelihood ratio for at least one of said prior stages.

8. The method of claim 7 wherein said ignoring comprises selecting a zero in place of said log-likelihood ratio.

9. An iterative decoding apparatus for a data channel, wherein:
said data channel includes a final stage and at least one prior stage,
each said stage comprises a SOVA detector that provides a non-return-to-zero output and a log-likelihood ratio output,
each stage other than said final stage further comprises an outer decoder that operates on said non-return-to-zero output and said log-likelihood ratio output, and
said final stage comprises said SOVA detector and lacks said outer decoder; said apparatus further comprising:
circuitry that, on detection of a defect, discounts data associated with said defect, said circuitry that discounts comprising, at each said outer decoder, circuitry that sets said log-likelihood ratio to zero; and
circuitry that bases a result on said outer decoder output from a prior stage, comprising circuitry that uses as said result said non-return-to-zero output from one of said prior stages.

10. The iterative decoding apparatus of claim 9 wherein said circuitry that bases a result on said outer decoder output from a prior stage uses as said result said non-return-to-zero output as operated upon by said outer decoder of said one of said stages immediately prior to said final stage.

11. The iterative decoding apparatus of claim 9 wherein:
said circuitry that sets said log-likelihood ratio to zero comprises a first selector that selects between zero and said log-likelihood ratio; and
said circuitry that uses said non-return-to-zero output from one of said prior stages comprises a second selector that selects between said non-return-to-zero output from said final stage and said non-return-to-zero output from one of said prior stages.

12. A method for recovering from a defect when decoding a data channel that uses iterative decoding, wherein:
said iterative decoding includes a plurality of stages; and
in at least one of said stages a log-likelihood ratio is computed and combined with data from a prior stage; said method comprising:
on detection of said defect, discounting data associated with said defect, said discounting comprising ignoring said log-likelihood ratio from a current stage; and
basing a result of said decoding on said data from said prior stage.

13. The method of claim 12 wherein said data from a prior stage comprises said log-likelihood ratio from said prior stage.

14. An iterative decoding apparatus for a data channel, said apparatus comprising:
a plurality of stages, each stage in said plurality of stages comprising:
a soft detector that provides detected data and an indication of reliability;
a selector that selects between said indication of reliability and another input; and
an outer decoder that operates on said detected data and output of said selector; wherein:
on detection of a defect, said selector selects said another input; and
on detection of said defect, a final stage outputs, as a result, output of said outer decoder from a stage in said plurality of stages immediately prior to said final stage.

15. The iterative decoding apparatus of claim 14 wherein said final stage lacks said outer decoder.

16. The iterative decoding apparatus of claim 14 wherein said another input is a zero.

* * * * *